(12) United States Patent
Besse et al.

(10) Patent No.: US 9,318,448 B2
(45) Date of Patent: Apr. 19, 2016

(54) PACKAGED SEMICONDUCTOR DEVICE, A SEMICONDUCTOR DEVICE AND A METHOD OF MANUFACTURING A PACKAGED SEMICONDUCTOR DEVICE

(75) Inventors: Patrice Besse, Tournefeuille (FR); Kamel Abouda, St Lys (FR); Valerie Bernon-Enjalbert, Fonsorbes (FR); Philippe Givelin, Leguevin (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/401,132

(22) PCT Filed: May 30, 2012

(86) PCT No.: PCT/IB2012/001208
§ 371 (c)(1),
(2), (4) Date: Nov. 14, 2014

(87) PCT Pub. No.: WO2013/179078
PCT Pub. Date: Dec. 5, 2013

(65) Prior Publication Data
US 2015/0129928 A1 May 14, 2015

(51) Int. Cl.
*H01L 23/60* (2006.01)
*H01L 27/02* (2006.01)
(Continued)

(52) U.S. Cl.
CPC .............. *H01L 23/60* (2013.01); *H01L 21/761* (2013.01); *H01L 21/76229* (2013.01); *H01L 27/0262* (2013.01); *H01L 29/74* (2013.01); *H01L 27/04* (2013.01); *H01L 29/7436* (2013.01);
(Continued)

(58) Field of Classification Search
CPC ... H01L 23/60; H01L 27/0262; H01L 21/761; H01L 21/76229; H01L 29/74
See application file for complete search history.

(56) References Cited

U.S. PATENT DOCUMENTS 5,021,860 A 6/1991 Bertotti et al.
5,545,917 A 8/1996 Peppiette et al.
(Continued)

OTHER PUBLICATIONS

International Search Report and Written Opinion correlating to PCT/IB2012/001208 dated Feb. 1, 2013.
(Continued)

*Primary Examiner* — Long Pham

(57) ABSTRACT

A packaged semiconductor device comprising a package and a semiconductor device is described. The semiconductor device comprises a first and a second GND-pad bonded to one or more GND-pins with a first and a second bond wire respectively, a first functional pad bonded to a first functional pin with a third bond wire, a semiconductor layer of a P-type conductivity, a first semiconductor component and a second semiconductor component. The first semiconductor component is arranged to, when a transient current is applied to the first functional pin, divert at least part of the transient current to the first GND-pad from the first P-region to the first GND-pad via at least a first PN-junction. The second semiconductor component comprises a second N-type region of a terminal of the second semiconductor component associated with the first functional pad. The first GND-pad is in contact with a second P-type region. The second GND-pad is in contact with a third N-type region. At least part of the second P-type region is arranged in between the first semiconductor component and the second semiconductor component, and at least part of the third N-type region is arranged in between the at least part of the first P-type region and the second semiconductor component.

20 Claims, 7 Drawing Sheets

(51) Int. Cl.
  *H01L 21/761* (2006.01)
  *H01L 21/762* (2006.01)
  *H01L 27/04* (2006.01)
  *H01L 29/74* (2006.01)

(52) U.S. Cl.
  CPC .............. *H01L2224/48091* (2013.01); *H01L 2224/49113* (2013.01); *H01L 2924/13034* (2013.01); *H01L 2924/30107* (2013.01)

(56) References Cited

U.S. PATENT DOCUMENTS

| | | |
|---|---|---|
| 5,754,381 A | 5/1998 | Ker |
| 6,576,934 B2 | 6/2003 | Cheng et al. |
| 2004/0164354 A1 | 8/2004 | Mergens et al. |
| 2005/0133870 A1 | 6/2005 | Manna et al. |
| 2008/0211027 A1 | 9/2008 | Lin et al. |
| 2011/0199346 A1 | 8/2011 | Ko et al. |

OTHER PUBLICATIONS

O. Gonnard et al: "Multi-ring Active Analogic Protection for Minority Carrier Injection Suppression in Smart Power Technology", Proceedings of 2001 International Symposium on Power Semiconductor Devices & ICs, Osaka, pp. 351-354.

Guillaume De Cremoux et al: "Simulations and Measurements of Cross-Talk Phenomena in BiCMOS Technology for Hard Disk Drives", Electron Devices Meeting, 1996. IEDM '96, International, San Francisco, CA, USA, Dec. 8-11, 1996, pp. 481-484.

PACKAGED SEMICONDUCTOR DEVICE, A SEMICONDUCTOR DEVICE AND A METHOD OF MANUFACTURING A PACKAGED SEMICONDUCTOR DEVICE

FIELD OF THE INVENTION

This invention relates to a packaged semiconductor device, a semiconductor device and a method of manufacturing a packaged semiconductor device.

BACKGROUND OF THE INVENTION

Uncontrolled electrostatic discharge (ESD) is known as a major cause of malfunctioning of electrical equipment. A semiconductor device may e.g. be susceptible to damage when a large current transient, provided to one if its pins (e.g., IO pin, input pin, output pin, supply pin), is injected into the semiconductor substrate and permanently damage semiconductor components of the device. A semiconductor device is therefore usually provided with an ESD protection circuit which may to some extent protect the semiconductor device against ESD.

SUMMARY OF THE INVENTION

The present invention provides a packaged semiconductor device and a semiconductor device and a method of manufacturing a packaged semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
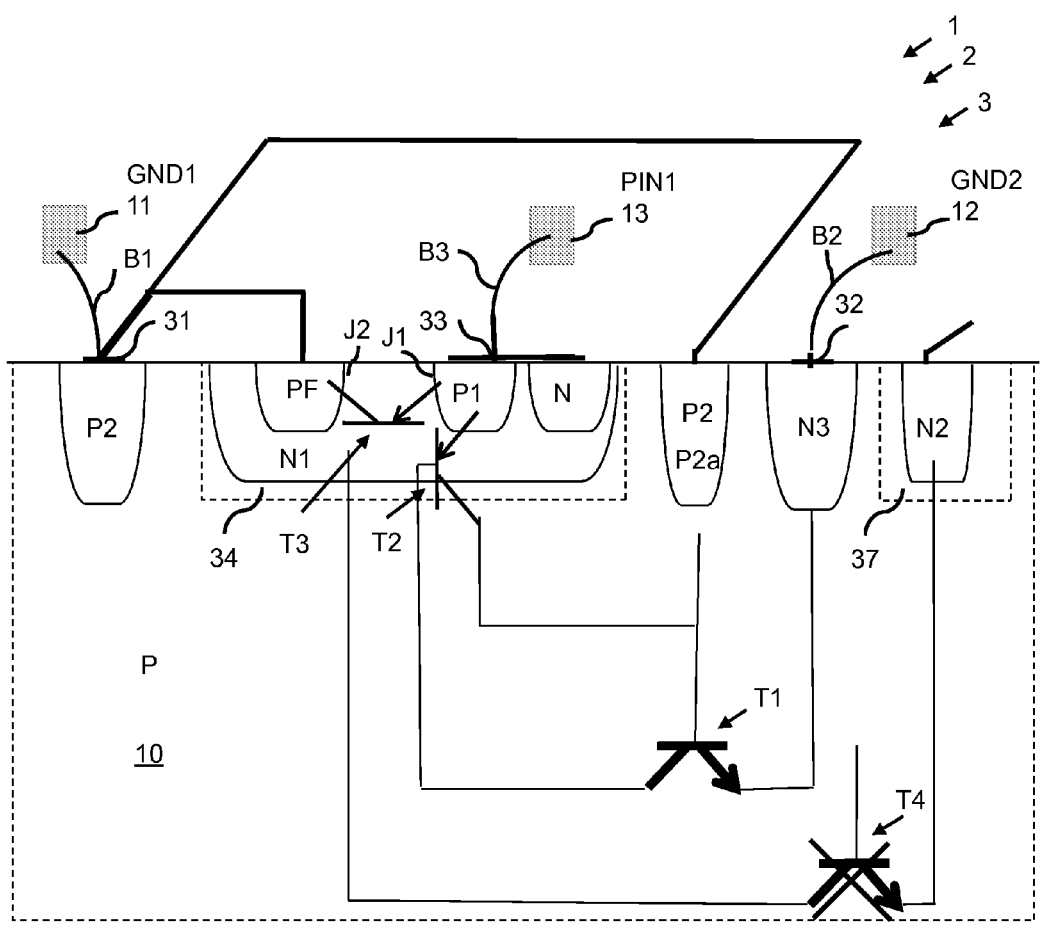
FIG. 1 schematically shows an example of an embodiment of a packaged semiconductor device, during a positive ESD stress.
Figure 2:
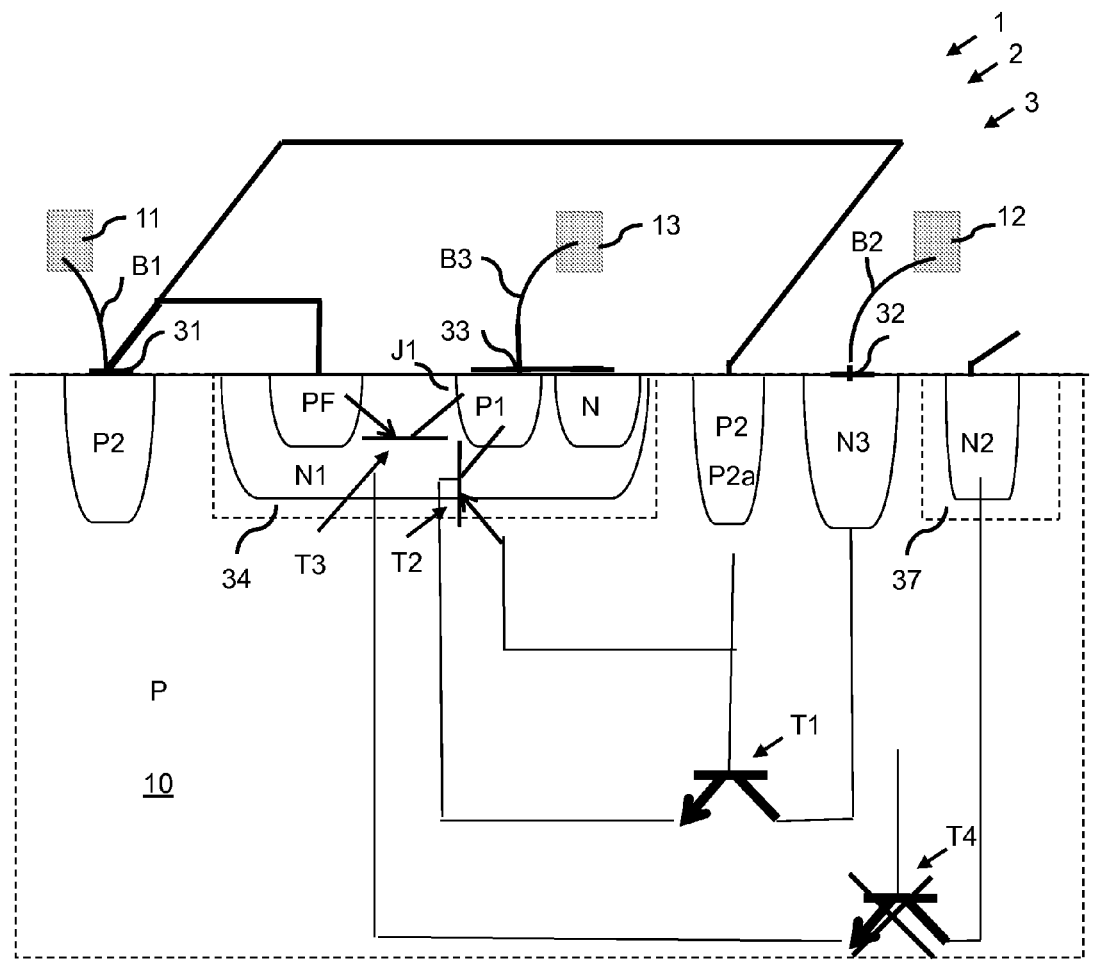
FIG. 2 schematically shows an example during a negative ESD stress.

FIGS. 1 and 2 schematically shows an example of an embodiment of a packaged semiconductor device 1. FIG. 1 shows the packaged semiconductor device during a positive ESD stress, i.e., where a positive voltage ESD voltage is applied to a functional pin 13 and a corresponding large transient current is applied to the functional pin. FIG. 2 shows the packaged semiconductor device during a negative ESD stress, i.e. at an opposite polarity of the transient current. The packaged semiconductor device 1 comprises a package 2 and a semiconductor device 3. The semiconductor device 3 comprises a first GND-pad 31 and a second GND-pad 32 bonded to one or more GND-pins 11, 12 (GND1, GND2) of the package 2 with a first bond wire B1 and a second bond wire B2 respectively. A first functional pad 33 is bonded to a first functional pin 13 (PIN1) of the package with a third bond wire B3. In the following, reference may be made to the first functional pad 33 as first IO pad and to the first functional pin 13 as a first IO pin, to clearly distinguish against the GND-pads and GND-pins, but the first functional pad and first functional pin may relate to any type of functional pad and pin of the semiconductor device, such as an IO pad and IO pin, an input pad and input pin, an output pad and output pin, a supply pad and supply pin. The term "GND-pin" relates to a pin arranged to connect to a reference voltage, such as ground, and may also be referred to as "reference pin". The term "GND-pad" relates to a pad bonded to a GND-pin. When the semiconductor device is not yet bonded to the pins, the term "GND-pad" relates to a pad arranged to be bonded to a GND-pin. The term "GND-pad" may also be referred to as "reference pad".

The semiconductor device 3 has a semiconductor layer 10 of a P-type conductivity. A first semiconductor component 34 is formed in the semiconductor layer 10. The first semiconductor component 34 comprises a first P-type region P1 and a first N-type region N1. The first N-type region extends N1 from the surface of the semiconductor layer. The first functional pad 33 is in contact with the first P-type region P1. The first N-type region N1 isolates the first P-type region P1 from the semiconductor layer 10. The first semiconductor component 34 is arranged to, when a transient current is applied to the first functional pin 13, divert at least part of the transient current applied to the first functional pin to the first GND-pad from the first P-region to the first GND-pad via a first PN-junction J1.

In this example, the first PN-junction J1 is part of a PNP transistor T3. In this, the first P-type region P1 and a first further P-type region PF are formed in the first N-type region N1. The first PN-junction J1 is formed by the first P-type region P1 and the first N-type region N1. A second first PN-junction J2 is formed by the first further P-type region PF and the first N-type region N1. The first N-type region isolates the first further P-region PF from the semiconductor layer 10 and from the first P-type region P1. The first PN-junction J1 is thus formed by the by the first P-type region P1 and the first N-type region N1 as part of the PNP-transistor T3 formed by the first P-type region P1, the first N-type region N1 and the first further P-type region PF. Hereby, a transient current, applied to the first functional pin, may be diverted, at least partly, via the PNP transistor T3 to the first GND-pad 31 and from there out of the semiconductor device 3 via the first bond wire B1 to the first GND-pin 11. In an alternative embodiment, the first PN-junction may form a diode. The semiconductor device 3 further comprises a second semiconductor component 37 formed in the semiconductor layer 10. The second semiconductor component 37 comprises a second N-type region N2 of a terminal of the second semiconductor component 37 associated with the first functional pad 33. A second P-type region P2 is formed in the semiconductor layer. The second P-type region P2 is in contact with the first GND-pad 31. The second P-type region is isolated from first N-type region N1 of the first semiconductor component 34.

A third N-type region N3 is formed in the semiconductor layer 10. The second GND-pad 32 is in contact with the third N-type region N3. The third N-type region N3 is isolated from the first semiconductor component 34, the second semiconductor component (37) and the second P-type region P2.

At least part P2a of the second P-type region P2 is arranged in between the first semiconductor component 34 and the second semiconductor component 37. At least part of the third N-type region N3 is arranged in between the at least part of the first P-type region P1 and the second semiconductor component 37.

Hereby, the part of transient current on the first functional pin 13 that is diverted through the first semiconductor component 34, via the at least first PN-junction J1, to the first GND-pad 31 induces a voltage across the first bond wire B1 to the associated GND-pin 11 due to the self-inductance of the first bond wire B1. For example, a 63 V ESD voltage may result in a transient current with an increase of 20 A in 20 ns in a 6 nH bond wire, resulting in an induced voltage of 6V, The induced voltage increases the voltage of the second P-type region P2. The third N-type region N3 may however remain substantially at zero volt as it is connected at GND via the second GND-pin 12. This may activate a first NPN transistor T1 formed by the first N-type region N1, the semiconductor layer 10 and the third N-type region N3, with the second P-type region P2, being in contact with the semiconductor layer 10, acting as control terminal (base) of the first NPN transistor T1, as schematically indicated in FIG. 1. Thereby, the transient current may, partly or fully, be diverted to flow from the first semiconductor component 34 to the second GND-pad 32 and thus directed to the second GND-pin 12, out of the semiconductor device 3. A large current to the second semiconductor component 37 is hereby prevented. This may also be seen as activating a silicon controlled rectifier (SCR) formed by a PNP transistor T2 and the first NPN transistor T1, the PNP transistor T2 being formed by the first P-type region P1, the first N-type region N1 and the semiconductor layer 10.

The activation of the SCR diverts the transient current from the first semiconductor component 34 to the second GND-pad 32, thereby preventing a large current to flow to the second semiconductor component 37. This results in an improved protection against ESD damage of the second semiconductor component 37. This may be compared to the situation in a prior art device where no combination of a second P-type region P2 and a third N-type region N3 is provided in between the first semiconductor component 34 and second semiconductor component 37: there, an NPN transistor T4 would have formed by the first N-type region N1, the P-type semiconductor layer 10 and the second N-type region N2, and this NPN transistor T4 would have directed at least part of the transient current to the second semiconductor device 37. Although such prior art device may provide some ESD protection via a PN-junction formed similarly as the first PN-junction J1 according to the exemplary embodiment, the ESD protection of such prior art device is compromised. Further, the ESD protection of the device according to the embodiment may be effective against positive as well as negative ESD stress (i.e., positive and negative currents into the device from the functional pin), as may be clear to the skilled person from the schematic indication in FIG. 2 from the effective state of transistors T1, T2, T3 and T4 during a negative ESD stress indicated in FIG. 2.

During normal operation of the packaged semiconductor device at normal current levels, no such current path to the third N-type region N3 will be activated, and quasi DC currents would be conducted through the semiconductor layer 10 from the first functional pad 33 to the second N-type region N2 of the second semiconductor component 37.

According to an embodiment, the first functional pad 33 corresponds to a supply pad. The first functional pad may thus correspond to e.g. an supply pad or a drive pad, for receiving a supply voltage or supply current from an external device, or for providing a supply voltage or a supply current to an external device.

According to another embodiment, the first functional pad 33 corresponds to an interface pad. The first functional pad may thus correspond to e.g. an IO pad, an input pad or an output pad for, respectively, communicating, receiving or providing a signal, such as a data signal, a clock signal, a drive signal, a buffer signal.

Figure 3:
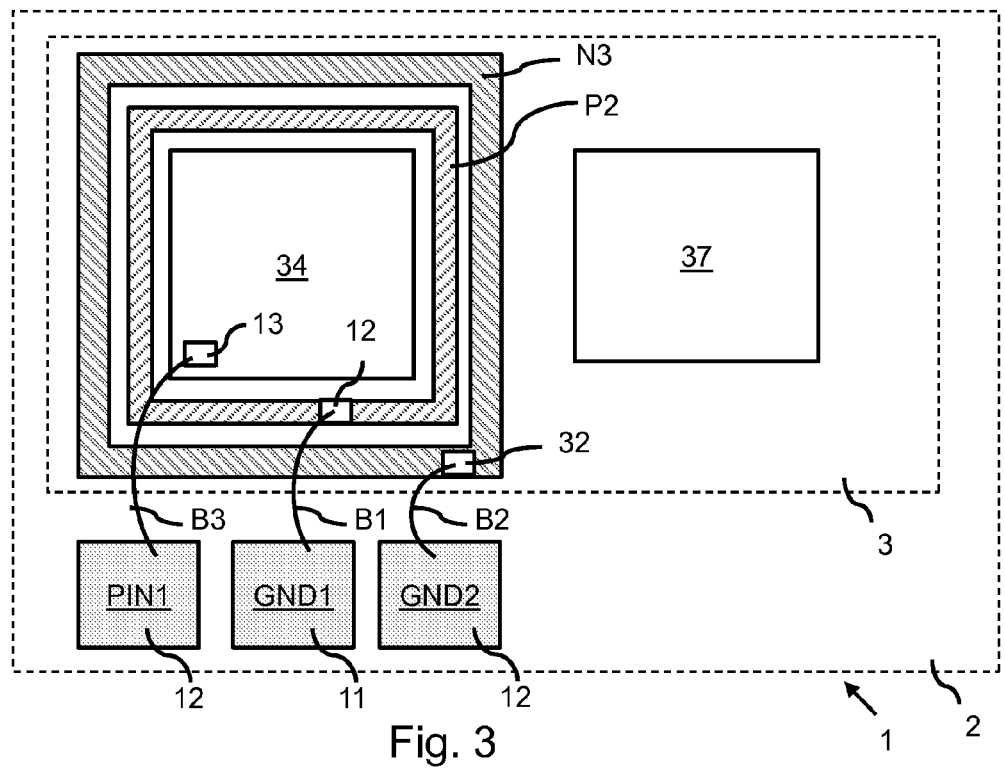
FIG. 3-FIG. 7 schematically show examples of arrangements according to embodiments.

FIG. 3 shows an exemplary arrangement of the first semiconductor component 34, the second semiconductor component 37, the second P-type region P2 and the third N-type region N3. FIG. 3 further shows that the first GND-pad 31 bonded with the first bond wire B1 to first GND-pin 11, the second GND-pad 32 bonded with the second bond wire B2 to second GND-pin 12, and the first functional pad 33 bonded to the first functional pin 13 the third bond wire B3. In the arrangement shown in FIG. 3, the second P-type region P2 is ring-shaped and surrounds the first semiconductor component 34 and the third N-type region N3 is also ring-shaped and surround the second P-type region P2. Herein, a ring-shape may relate to e.g. a circular, square, rectangular or another closed contour.

Figure 4:
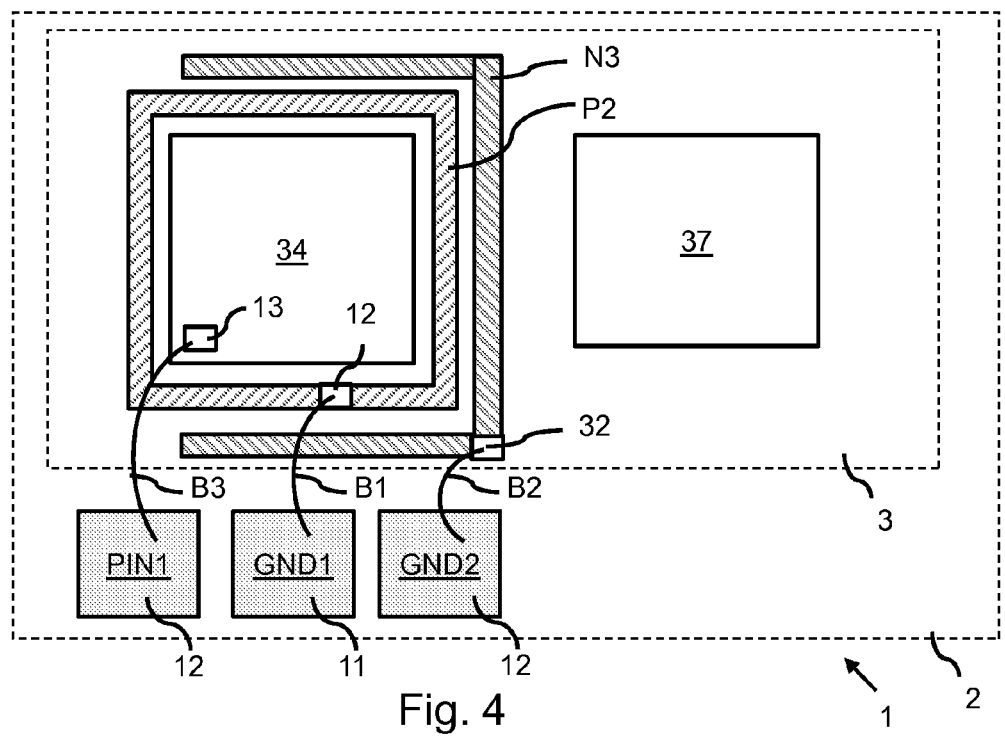

FIG. 4 shows an alternative arrangement. The arrangement shown in FIG. 4 differs from the arrangement shown in FIG. 3 in that the third N-type region N3 is U-shaped. In this example, the second P-type region is ring-shaped, but the second P-type region may alternatively be e.g. I-shaped or also U-shaped.

A ring-shape or a U-shape of the second P-type region P2 and/or of the third N-type region N3 may provide an improved activation of the first NPN transistor T1 formed by the first N-type region N1, the second P-type region P2 and the third N-type region N3, and by that an improved ESD protection.

Figure 5:
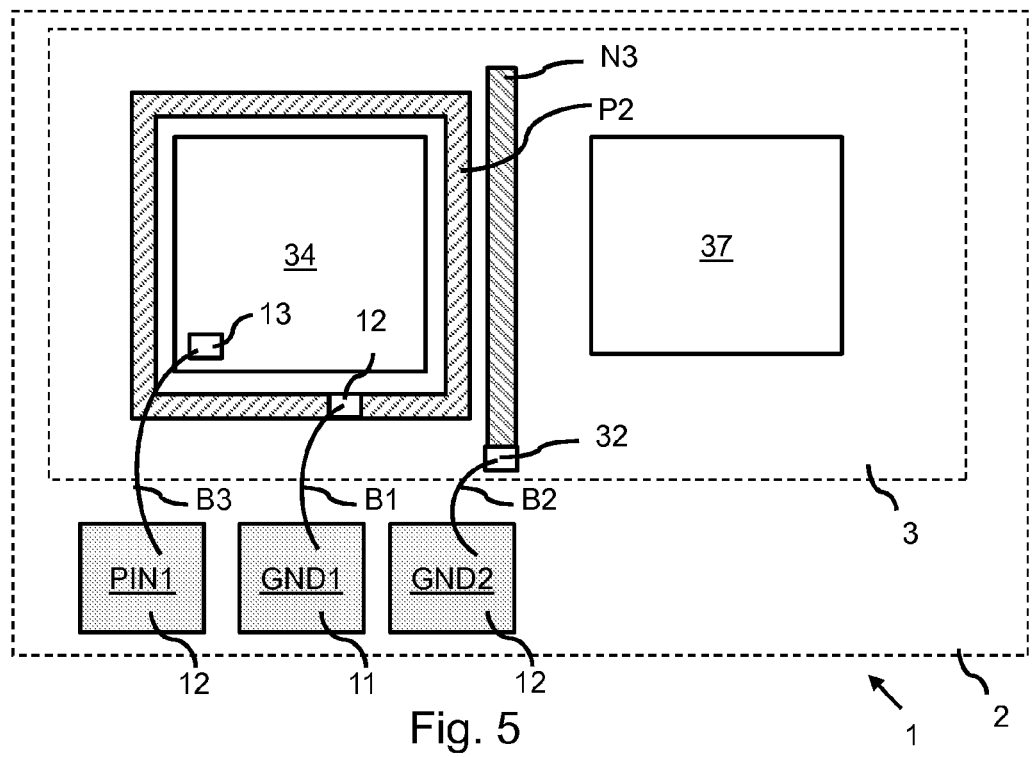
Figure 6:
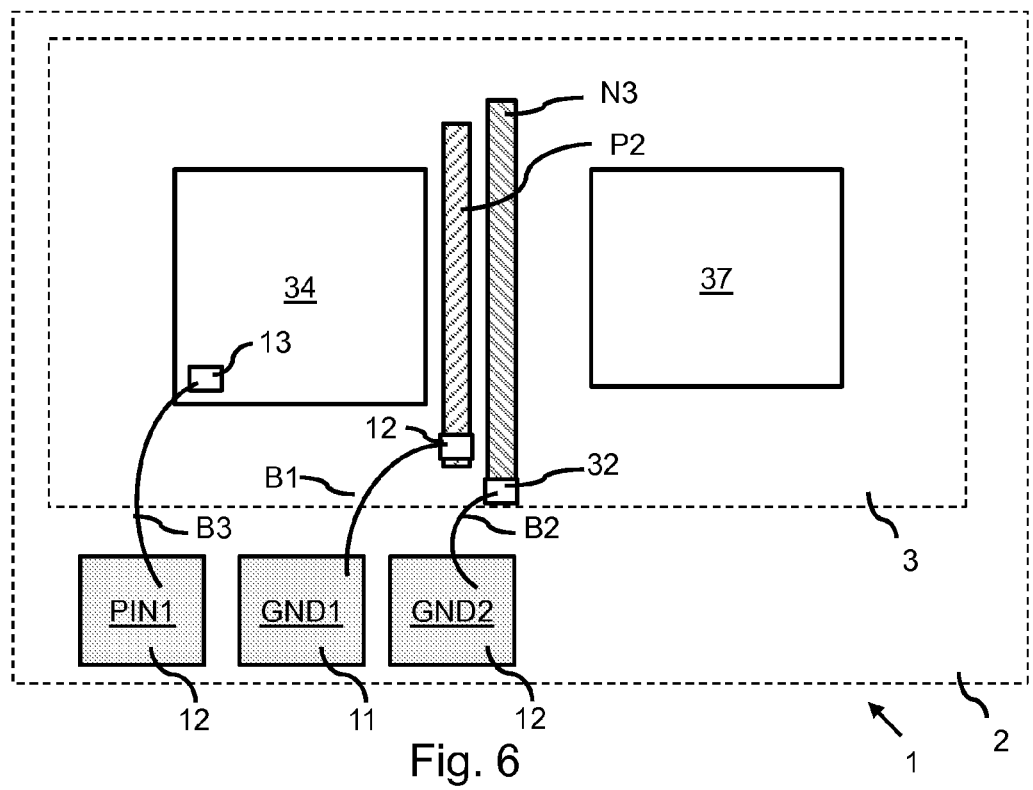

FIG. 5 shows an alternative arrangement. The arrangement shown in FIG. 4 differs from the arrangement shown in FIG. 4 in that the third N-type region N3 is line-shaped. Such line-shape may also be referred to as I-shaped. FIG. 6 shows another alternative arrangement. The arrangement shown in FIG. 6 differs from the arrangement shown in FIG. 5 in that also the second P-type region P2 is line-shaped. Such line-shape may also be referred to as I-shaped. An I-shaped second P-type region P2 or an I-shaped third N-type region N3 may be relatively area-efficient compared to ring-shaped regions.

Thus, in an embodiment, the second P-type region P2 is I-shaped. Such I-shape may be relatively area-efficient. In an embodiment, the second P-type region P2 is at least partly surrounding the first semiconductor component 34. The second P-type region P2 may be ring-shaped and surrounding the first semiconductor component 34. Herein, a ring-shape may relate to a circular, square, rectangular or another closed contour. The second P-type region P2 may be U-shaped. A ring-shape or U-shape may correspond to an improved activation of the first NPN transistor formed by the first N-type region, the second P-type region and the third N-type region, and by that an improved ESD protection. In an embodiment, the third N-type region N3 is I-shaped. In other embodiments, the third N-type region is U-shaped or ring-shaped. Although it may theoretically be sufficient if the N-type region is placed in an I-shape between the second P-type region and the second semiconductor component for diverting the transient current, a U-shape or ring-shape may result in an improved robustness. In an embodiment, the second P-type region is I-shaped and the third N-type region is I-shaped. Hereby, the first semiconductor component, the second P-type region, the third N-type region and the second semiconductor component are arranged substantially side-by-side. In embodiment, the second P-type region and the third N-type region are both U-shaped or both ring-shaped and substantially concentric.

In the examples shown in FIG. 3-FIG. 6, the first GND-pad 31 is bonded with the first bond wire B1 to a first GND-pin 11 of the one or more GND-pins of the package and the second GND-pad 32 is bonded with the second bond wire B2 to a second GND-pin 12 of the one or more GND-pins of the package. The current paths to the first and second GND-pins may hereby be separated. In further embodiments, the first GND-pad 31 is bonded with a plurality of first bond wires B1 to the first GND-pin 11 and/or the second GND-pad 32 is bonded with a plurality if second bond wires B2 to the second GND-pin 12. Bonding a pad to a pin with a plurality of bond wires may be capable to sustain larger currents compared to bonding with a single bond wire.

Figure 7:
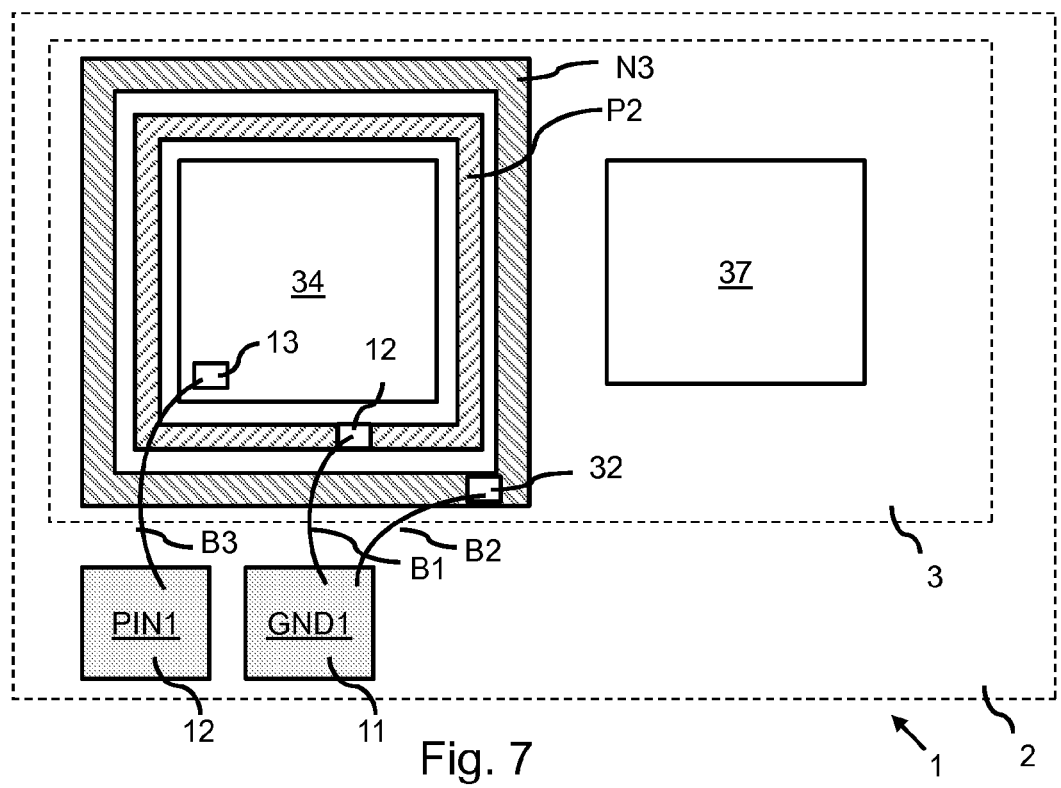

FIG. 7 schematically shows an alternative example. In the alternative example shown in FIG. 7, the first GND-pad 31 and the second GND-pad 32 are bonded to the same GND-pin 11 of the one or more GND-pins of the package with the first bond wire B1 and the second bond wire B2 respectively. Hereby, both first and second GND-pads are connected to same GND-pin, whereby no additional pin is needed for being able to bond the second P-type region to a GND-pin. In further embodiments, the first GND-pad (31) and the second GND-pad 32 are bonded to the same GND-pin 11 with a plurality of first bond wires B1 and a plurality of second bond wires B2 respectively.

Figure 8:
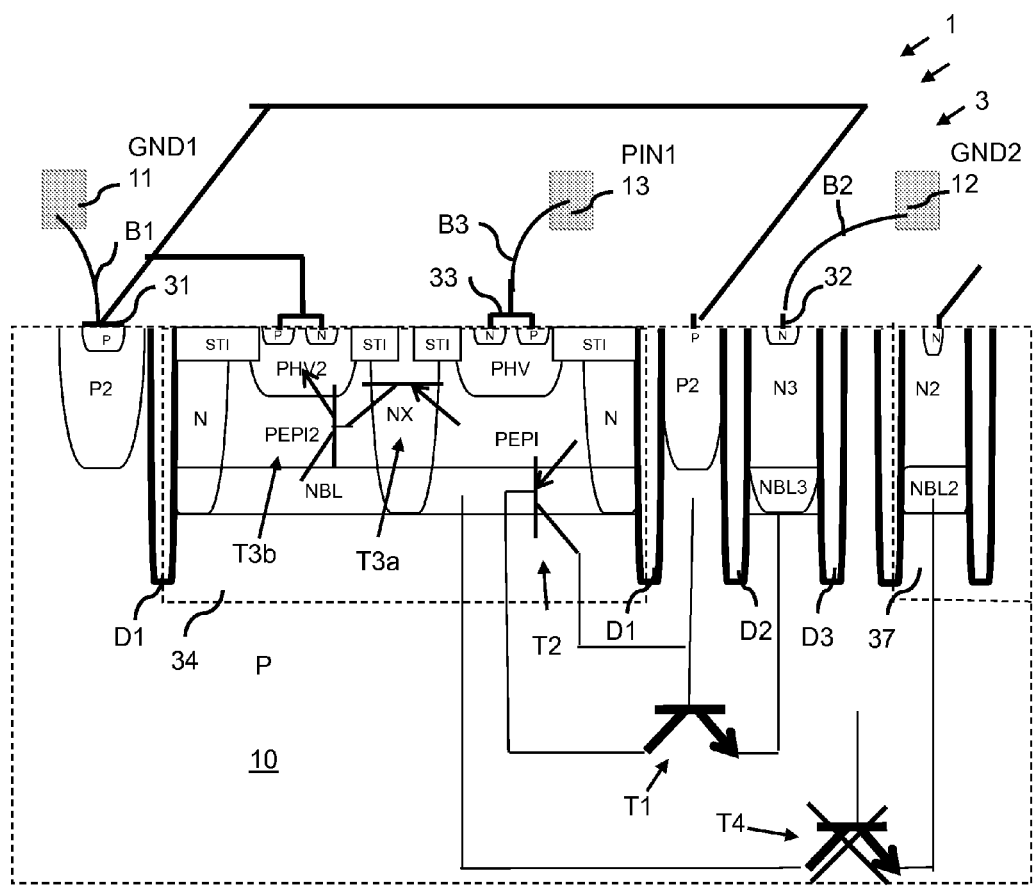
FIG. 8 schematically shows an example of another embodiment of a packaged semiconductor, during a positive ESD stress.

FIG. 8 schematically shows another example of an embodiment of a packaged semiconductor device 1. FIG. 8 shows the packaged semiconductor device during a positive ESD stress, i.e., where a positive voltage ESD voltage is applied to a functional pin 13 and a corresponding large transient current is applied to the functional pin. Based on the description given below and a comparison with FIG. 1 and FIG. 2, the skilled person will understand the behaviour of the example during a negative ESD stress, i.e. at an opposite polarity of the transient current. The packaged semiconductor device 1 comprises a package 2 and a semiconductor device 3. The semiconductor device 3 comprises a first GND-pad 31 and a second GND-pad 32 bonded to one or more GND-pins 11, 12 (GND1, GND2) of the package 2 with a first bond wire B1 and a second bond wire B2 respectively. A first functional pad 33 is bonded to a first functional pin 13 (PIN1) of the package with a third bond wire B3. In the following, reference may again be made to the first functional pad 33 as first IO pad and to the first functional pin 13 as a first IO pin, to clearly distinguish against the GND-pads and GND-pins, but the first functional pad and first functional pin may relate to any type of functional pad and pin of the semiconductor device, such as an IO pad and IO pin, an input pad and input pin, an output pad and output pin, a supply pad and supply pin The semiconductor device 3 has a semiconductor layer 10 of a P-type conductivity. A first semiconductor component 34 is formed in the semiconductor layer 10. The first semiconductor component 34 comprises a first P-type region PEPI and a first N-type region NBL. The first N-type region NBL is a part of an N-type buried layer, which may be provided by local N-type doping the semiconductor layer 10 or by growth of an N-type epitaxial layer. The first P-type region PEPI may be a first part of an epitaxial P-type layer, grown on the first N-type region NBL. The first functional pad 33 comprises a P-region PHV and is herewith in contact with the first P-type region PEPI. The first N-type region N1 isolates the first P-type region PEPI from the semiconductor layer 10. The first semiconductor component 34 is arranged to, when a transient current is applied to the first functional pin 13, divert at least part of the transient current applied to the first functional pin to the first GND-pad from the first P-region to the first GND-pad via a first PN-junction J1. The packaged semiconductor device 1 of FIG. 8 shows an example of a high-voltage device wherein regions of shallow trench isolation STI may be provided (as shown) at the surface of the semiconductor device in between neighbouring regions to prevent leakage via the surface of the semiconductor device between neighbouring regions or close to the surface of the of the semiconductor device. Further, pads in a P-type region may be associated with a P-doped region in the P-type region at the surface of the semiconductor device or with an arrangement of a P-doped region and an N-doped region in the P-type region at the surface of the semiconductor device as shown e.g. for the PHV- and PHV2-regions shown in FIG. 8.

In this example, the first PN-junction J1 is part of a PNP transistor T3a. In this example, the first semiconductor component 34 comprises a second further P-type region PEPI2 and a further N-type region NX. The further N-type region NX isolates the second further P-region PEPI2 from the first P-type region PEPI. The first N-type region NBL isolates the second further P-region PEPI2 from the semiconductor layer 10. The second further P-type region PEPI2 may be a second part of the epitaxial P-type layer grown on the first N-type region NBL. The first PN-junction J1 is formed by the first P-type region PEPI and the further N-type region NX as part of a PNP-transistor T3a formed by the first P-type region PEP), the further N-type region NX and the second further P-type region PEPI2. A further NPN transistor T3b is formed by the first N-type region NBL, the second further P-region PEPI2 and a further P-region PHV2. The further P-region PHV2 is in contact with the first GND-pad 31. Hereby, the PNP-transistor T3a and the further NPN transistor T3b form a first silicon controlled rectified (SCR) with the first P-type region PEPI, the further N-type region NX, the second further P-type region PEPI2 and the further P-region PHV2. The first SCR which may divert, al least part, of a transient current applied to the first functional pin 31 to the first GND-pad 31. Thus, the transient current, applied to the first functional pin, may be diverted, at least partly, via the PNP transistor T3a and the further NPN transistor T3b to the first GND-pad 31 and from there out of the semiconductor device 3 via the first bond wire B1 to the first GND-pin 11.

The semiconductor device 3 shown in FIG. 8 further comprises a second semiconductor component 37 formed in the semiconductor layer 10. The second semiconductor component 37 comprises a second N-type region N2 of a terminal of the second semiconductor component 37 associated with the first functional pad 33. An N-type buried layer NBL2 may be provided in between the second N-type region N2 and the semiconductor layer 10. A second P-type region P2 is formed in the semiconductor layer. The second P-type region P2 is in contact with the first GND-pad 31. The second P-type region is isolated from first N-type region N1 of the first semiconductor component 34.

A third N-type region N3 is formed in the semiconductor layer 10. The second GND-pad 32 is in contact with the third N-type region N3. The third N-type region N3 is isolated from the first semiconductor component 34, the second semiconductor component 37 and the second P-type region P2. An N-type buried layer NBL3 may be provided in between the third N-type region N3 and the semiconductor layer 10.

At least part P2a of the second P-type region P2 is arranged in between the first semiconductor component 34 and the second semiconductor component 37. At least part of the third N-type region N3 is arranged in between the at least part of the first P-type region P1 and the second semiconductor component 37.

Hereby, the part of transient current on the first functional pin 13 that is diverted through the first semiconductor component 34, via the first SCR formed by T3a (including the first PN-junction J1) and T3b, to the first GND-pad 31 induces a voltage across the first bond wire B1 to the associated GND-pin 11 due to the self-inductance of the first bond wire B1. The induced voltage increases the voltage of the second P-type region P2. The third N-type region N3 may however remain substantially at zero volt as it is connected at GND via the second GND-pin 12. This may activate a first NPN transistor T1 formed by the first N-type region NBL, the semiconductor layer 10 and the third N-type region N3, with the second P-type region P2, being in contact with the semiconductor layer 10, acting as control terminal (base) of the first NPN transistor T1, as schematically indicated in FIG. 8. Thereby, the transient current may, partly or fully, be diverted to flow from the first semiconductor component 34 to the second GND-pad 32 and thus directed to the second GND-pin 12, out of the semiconductor device 3. A large current to the second semiconductor component 37 is hereby prevented. This may also be seen as activating a second silicon controlled rectifier (SCR) formed by a PNP transistor T2 and the first NPN transistor T1, the PNP transistor T2 being formed by the first P-type region PEPI, the first N-type region NBL and the semiconductor layer 10. The activation of the second SCR diverts the transient current from the first semiconductor component 34 to the second GND-pad 32, thereby preventing a large current to flow to the second semiconductor component 37. This results in an improved protection against ESD damage of the second semiconductor component 37. This may be compared to the situation in a prior art device where no combination of a second P-type region P2 and a third N-type region N3 is provided in between the first semiconductor component 34 and second semiconductor component 37: there, an NPN transistor T4 would have formed by the first N-type region N1, the P-type semiconductor layer 10 and the second N-type region N2, and this NPN transistor T4 would have directed at least part of the transient current to the second semiconductor device 37. Although such prior art device may provide some ESD protection via a PN-junction formed similarly as the first PN-junction J1 according to the example shown, the ESD protection of such prior art device is compromised. Further, the ESD protection of the device according to the example shown in FIG. 8 may be effective against positive as well as negative ESD stress (i.e., positive and negative currents into the device from the functional pin), as may be clear to the skilled person when comparing FIG. 8 to FIG. 1 and FIG. 2.

During normal operation of the packaged semiconductor device at normal current levels, no such current path to the third N-type region N3 will be activated, and quasi DC currents would be conducted through the semiconductor layer 10 from the first functional pad 33 to the second N-type region N2 of the second semiconductor component 37.

FIG. 8 thus shows an example of an embodiment, wherein the first N-type region NBL is at least part of an N-type buried layer.

FIG. 8 further shows that the semiconductor device may further comprise one or more trenches D1, D2, D3 extending from the surface of the semiconductor layer 10 into the semiconductor layer for isolating two or more of the first semiconductor component 34, the second semiconductor component 37, the second P-type region P2 and the third N-type region N3. In FIG. 8, trench D1 is positioned between the first semiconductor component 34 and the second P-type region, trench D2 is positioned between the second P-type region and the third N-type region N3, and trench D3 is positioned between the third N-type region N3 and the second semiconductor component 37.

FIG. 8 further shows that the one trench D1 between the second P-type region P2 and the first semiconductor component 34. The trench D1 isolates the second P-type region P2 from the first N-type buried layer NBL of the first semiconductor component 34. The trench D1 extends from the surface of the semiconductor layer 10 into the semiconductor layer up to a depth beyond the position of the first N-type buried layer NBL. Thus, in a further embodiment, the semiconductor device comprises a trench D1 between the second P-type region P2 and the first semiconductor component 34, the trench D1 isolating the second P-type region P2 from the first N-type buried layer NBL.

The further examples, embodiments and/or features described with reference to the example of FIG. 1 and FIG. 2 may also be used with the example of FIG. 8.

In embodiments, the semiconductor layer 10 is a semiconductor substrate. Examples have been described above with respect to FIG. 1 and FIG. 2, and FIG. 8.

Figure 9:
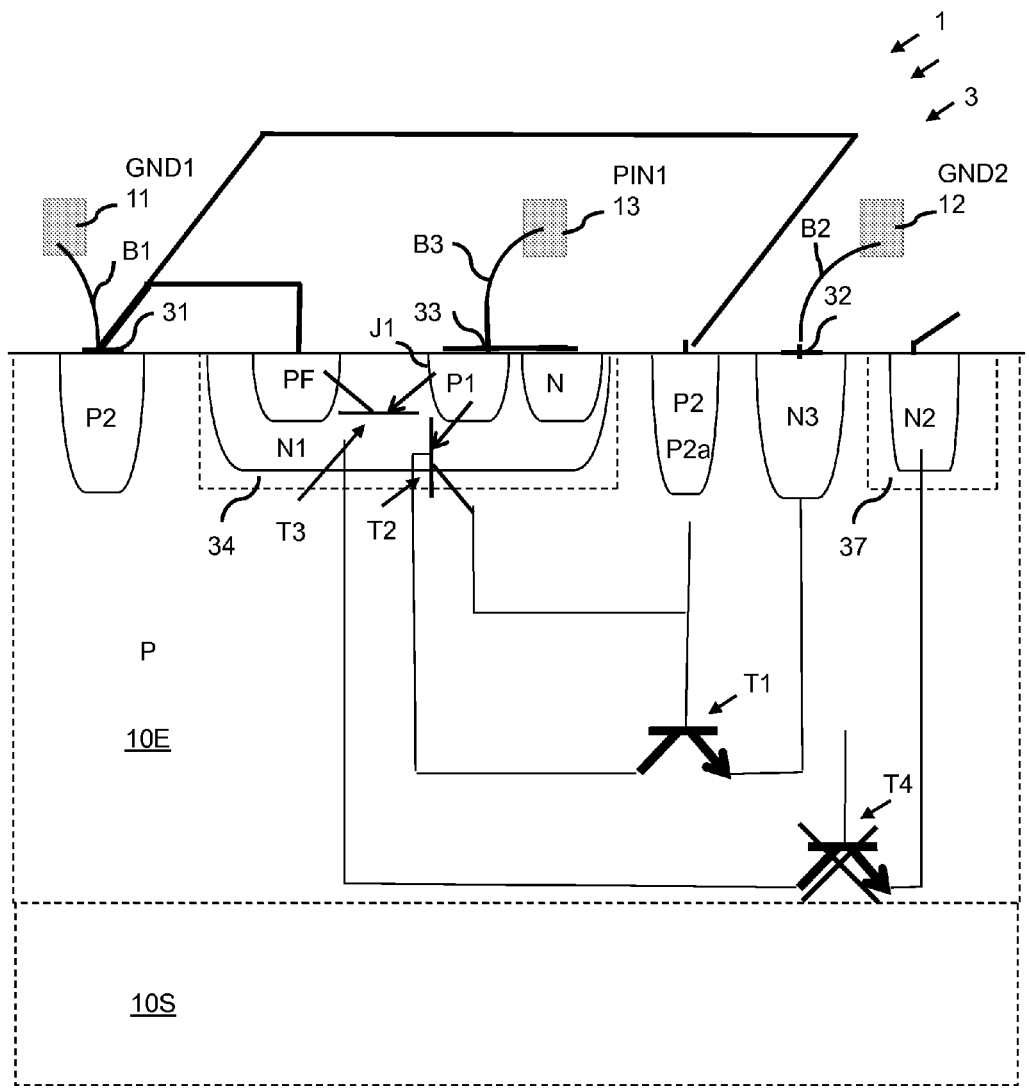
FIG. 9 schematically shows an example of again another embodiment of a packaged semiconductor, during a positive ESD stress.

In another embodiment, the semiconductor layer is a P-type epitaxial layer 10E formed over a semiconductor substrate 10S. An example is shown in FIG. 9. The example shown in FIG. 9 differs from that shown in FIG. 1 in that the semiconductor device comprises a P-type epitaxial layer 10E formed over a semiconductor substrate 10S. The first semiconductor component 34, the second semiconductor component 37, the second P-type region and the third N-type region N3 are formed in the semiconductor layer 10 formed by the P-type epitaxial layer 10E.

The examples and embodiments described above provide a packaged semiconductor device which may provide ESD protection against positive as well negative ESD stress, and may thus provide protection against majority carrier injection into the semiconductor layer 10 as well as against minority carrier injection.

A semiconductor device 2 suitable for use with a package 3 as a packaged semiconductor device 1 according to an embodiment is provided.

A method of manufacturing a packaged semiconductor device is provided. The method comprises providing a package 2 having one or more GND-pins 11, 12 (GND1, GND2) and a first functional pin 13 (PIN1), and providing a semiconductor device 3 according to an embodiment. Providing the semiconductor device 3 may comprise manufacturing the semiconductor device 3. The semiconductor device 3 thus has a first GND-pad 31, a second GND-pad 32 and a first functional pad 33. The method comprises bonding the first GND-pad 31 and the second GND-pad 32 of the semiconductor device 3 to the one or more GND-pins 11, 12 (GND1, GND2) of the package 2 with a first bond wire B1 and a second bond wire B2 respectively, or with a plurality if first bond wires B1 and a plurality of second bond wires B2 respectively. The method comprises bonding the first functional pad 33 to the first functional pin 13 (PIN1) of the package with a third bond wire B3 or a plurality of third bond wires B3.

In the foregoing specification, the invention has been described with reference to specific examples of embodiments of the invention. It will, however, be evident that various modifications and changes may be made therein without departing from the broader spirit and scope of the invention as set forth in the appended claims. Further, examples, embodiments and parts of examples and parts of embodiments, may be combined to form further embodiments. E.g., the exemplary arrangements shown FIG. 3 FIG. 7 may be used with the semiconductor devices shown in FIG. 1, FIG. 8 or FIG. 9. Further, embodiments may provide a first semiconductor component 34 using a combination of one or more diodes and/or one or more transistors and/or and/or one or more SCRs for diverting at least part of the current from the functional pad 33 to the first GND-pad 31 when a transient current is applied to the first functional pin 13, whereby a voltage is created due to the self-inductance of the first bond wire B1 between the first GND-pad 31 and the first GND-pin 11.

The semiconductor substrate described herein can be any semiconductor material or combinations of materials, such as gallium arsenide, silicon germanium, silicon, monocrystalline silicon, the like, and combinations of the above.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A packaged semiconductor device comprising a package and a semiconductor device, the semiconductor device comprising:
    a first GND-pad and a second GND-pad bonded to one or more GND-pins of the package with a first bond wire and a second bond wire respectively;
    a first functional pad bonded to a first functional pin of the package with a third bond wire;
    a semiconductor layer of a P-type conductivity;
    a first semiconductor component formed in the semiconductor layer, the first semiconductor component comprising a first P-type region and a first N-type region, the first functional pad being in contact with the first P-type region, the first N-type region isolating the first P-type region from the semiconductor layer, and the first semiconductor component being arranged to, when a transient current is applied to the first functional pin, divert at least part of the transient current applied to the first functional pin to the first GND-pad from the first P-region to the first GND-pad via at least a first PN-junction;
    a second semiconductor component formed in the semiconductor layer, the second semiconductor component comprising a second N-type region of a terminal of the second semiconductor component associated with the first functional pad;
    a second P-type region formed in the semiconductor layer, the first GND-pad being in contact with the second P-type region, the second P-type region being isolated from first N-type region of the first semiconductor component;
    a third N-type region formed in the semiconductor layer, the second GND-pad being in contact with the third N-type region, the third N-type region being isolated from the first semiconductor component, the second semiconductor component and the second P-type region;
    at least part of the second P-type region being arranged in between the first semiconductor component and the second semiconductor component; and
    at least part of the third N-type region being arranged in between the at least part of the first P-type region and the second semiconductor component.

2. A packaged semiconductor device according to claim 1, wherein the first P-type region is formed in the first N-type region, and the first PN-junction is formed by the first P-type region and the first N-type region.

3. A packaged semiconductor device according to claim 1, wherein the first P-type region is formed in the first N-type region, a first further P-type region is formed in the first N-type region, and the first PN-junction is formed by the first P-type region and the first N-type region, the first N-type region isolating the first further P-region from the semiconductor layer and from the first P-type region, and the first PN-junction is formed by the first P-type region and the first N-type region as part of a PNP-transistor formed by the first P-type region, the first N-type region and the first further P-type region.

4. A packaged semiconductor device according to claim 1, wherein the first semiconductor component comprises a second further P-type region and a further N-type region, the further N-type region isolating the second further P-region from the first P-region, the first N-type region isolating the second further P-region from the semiconductor layer, the first PN-junction being formed by the first P-type region and the further N-type region as part of a PNP-transistor formed by the first P-type region, the further N-type region and the second further P-type region.

5. A packaged semiconductor device according to claim 1, the second P-type region being I-shaped.

6. A packaged semiconductor device according to claim 1, the second P-type region at least partly surrounding the first semiconductor component.

7. A packaged semiconductor device according to claim 6, the second P-type region being ring-shaped and surrounding the first semiconductor component.

8. A packaged semiconductor device according to claim 6, the second P-type region being U-shaped.

9. A packaged semiconductor device according to claim 1, the third N-type region being I-shaped, U-shaped or ring-shaped.

10. A packaged semiconductor device according to claim 1, the first N-type region extending from the surface of the semiconductor layer.

11. A packaged semiconductor device according to claim 1, the first N-type region being at least a part of an N-type buried layer.

12. A packaged semiconductor device according to claim 11, comprising a trench between the second P-type region and the first semiconductor component, the trench isolating the second P-type region from the at least part of the first N-type buried layer.

13. A packaged semiconductor device according to claim 1, the semiconductor layer being a P-type epitaxial layer formed over a semiconductor substrate.

14. A packaged semiconductor device according to claim 1, the semiconductor layer being a semiconductor substrate.

15. A packaged semiconductor device according to claim 1, the first GND-pad being bonded with the first bond wire to a first GND-pin of the one or more GND-pins of the package and the second GND-pad being bonded with the second bond wire to a second GND-pin of the one or more GND-pins of the package.

16. A packaged semiconductor device according to claim 1, the first GND-pad and the second GND-pad being bonded to the same GND-pin of the one or more GND-pins of the package with the first bond wire and the second bond wire respectively.

17. A packaged semiconductor device according to claim 1, wherein the first functional pad corresponds to a supply pad.

18. A packaged semiconductor device according to claim 1, wherein the first functional pad corresponds to an interface pad.

19. A semiconductor device comprising:
a first GND-pad and a second GND-pad bonded to one or more GND-pins of the package with a first bond wire and a second bond wire respectively;
a first functional pad bonded to a first functional in of the package with a third bond wire;
a semiconductor layer of a P-type conductivity;
a first semiconductor component formed in the semiconductor layer, the first semiconductor component comprising a first P-type region and a first N-type region, the first functional pad being in contact with the first P-type region, the first N-type region isolating the first P-type region from the semiconductor layer, and the first semiconductor component being arranged to, when a transient current is applied to the first functional pin, divert at least part of the transient current applied to the first functional in to the first GND-pad from the first P-region to the first GND-pad via at least a first PN-junction;
a second semiconductor component formed in the semiconductor layer, the second semiconductor component comprising a second N-type region of a terminal of the second semiconductor component associated with the first functional pad;
a second P-type region formed in the semiconductor layer, the first GND-pad being in contact with the second P-type region, the second P-type region being isolated from first N-type region of the first semiconductor component;
a third N-type region formed in the semiconductor layer, the second GND-pad being in contact with the third N-type region, the third N-type region being isolated from the first semiconductor component, the second semiconductor component and the second P-type region;
at least part of the second P-type region being arranged in between the first semiconductor component and the second semiconductor component; and
at least part of the third N-type region being arranged in between the at least part of the first P-type region and the second semiconductor component.

20. A semiconductor device according to claim 19, wherein the first P-type region is formed in the first N-type region, and the first PN-junction is formed by the first P-type region and the first N-type region.

* * * * *